(12) United States Patent
Ng et al.

(10) Patent No.: US 7,718,545 B1
(45) Date of Patent: May 18, 2010

(54) FABRICATION PROCESS

(75) Inventors: Hou Tee Ng, Mountain View, CA (US); Alfred I-Tsung Pan, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 658 days.

(21) Appl. No.: 11/590,372

(22) Filed: Oct. 30, 2006

(51) Int. Cl.
*H01L 21/31* (2006.01)
*H01L 21/469* (2006.01)

(52) U.S. Cl. .................. 438/758; 438/626; 438/631; 438/645; 257/E21.621; 257/E29.262

(58) Field of Classification Search .............. 438/758, 438/22–48, 626, 631, 645; 257/330–328, 257/E21.621, E29.262; 977/700
See application file for complete search history.

(56) References Cited

U.S. PATENT DOCUMENTS

| 2002/0036931 A1* | 3/2002 | Lowrey et al. ............. 365/200 |
| 2002/0159316 A1* | 10/2002 | Weinrich .................... 365/200 |
| 2007/0290257 A1* | 12/2007 | Kraft et al. ................. 257/330 |

* cited by examiner

*Primary Examiner*—Alexander G Ghyka
*Assistant Examiner*—Abdulfattah Mustapha

(57) ABSTRACT

A fabrication process, including forming one or more layers on at least a sidewall of a topographical feature of a substantially planar substrate, the sidewall being substantially orthogonal to the substrate; and planarizing respective portions of the one or more layers to form a planar surface substantially parallel to the substrate, wherein the planar surface includes respective co-planar surfaces of the one or more layers, at least one of the surfaces having a dimension determined by a thickness of the corresponding layer.

23 Claims, 13 Drawing Sheets

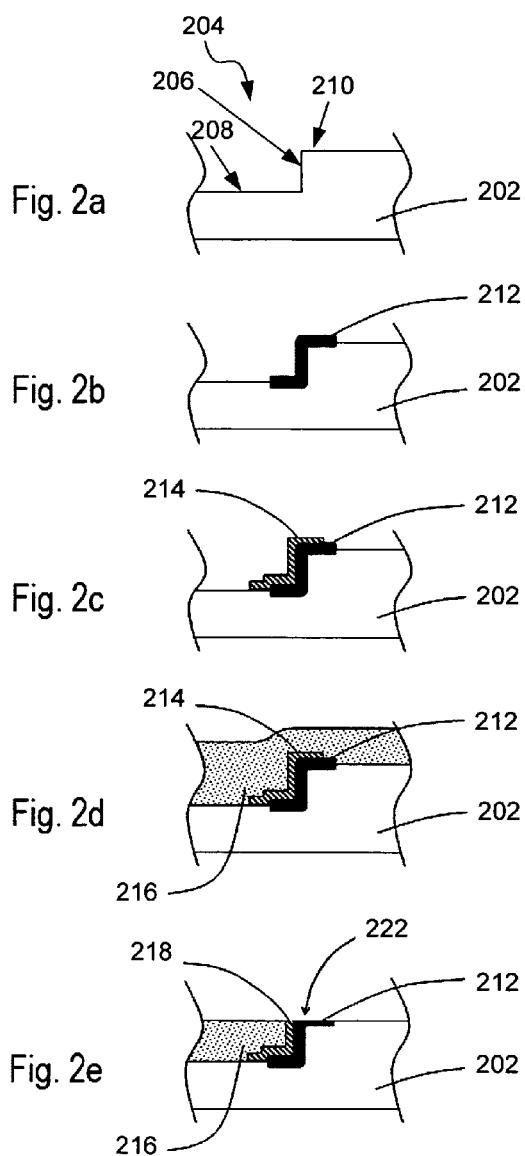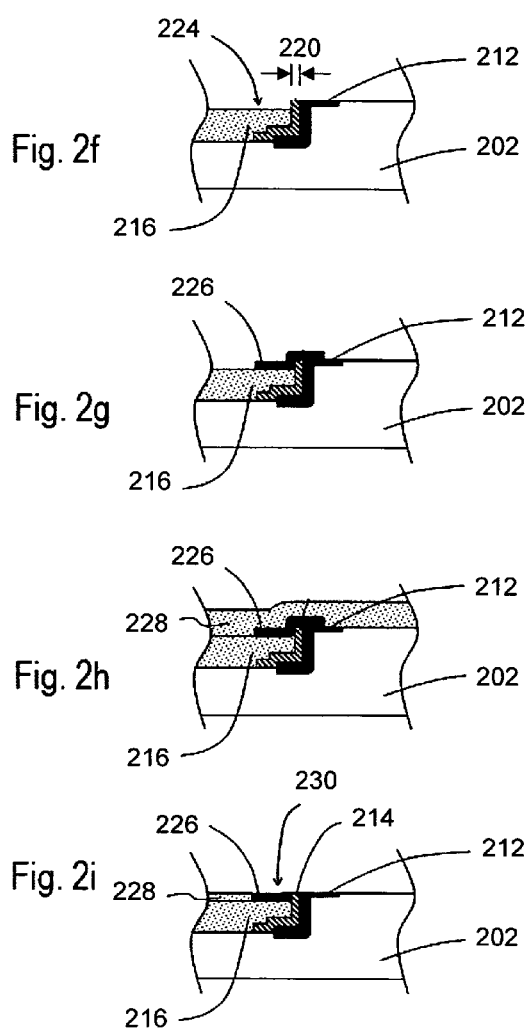

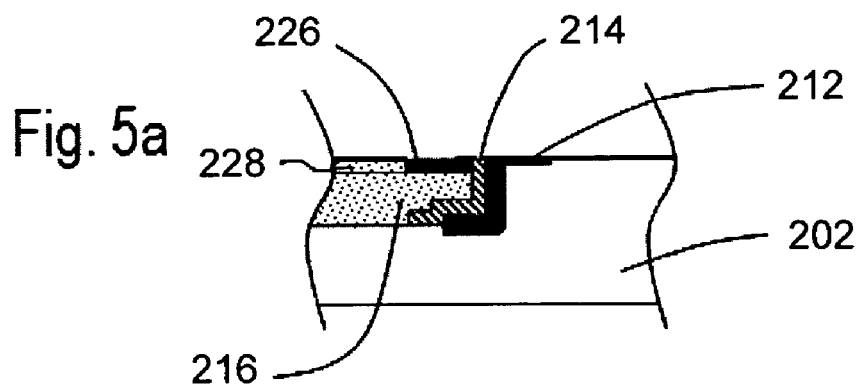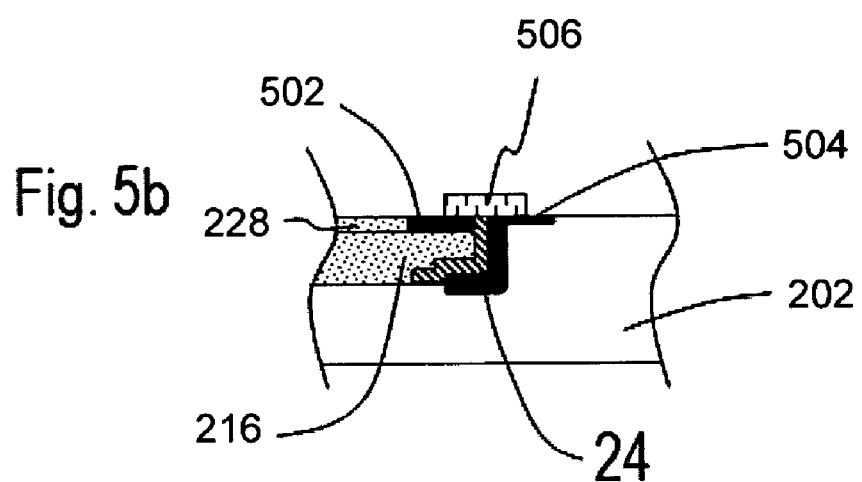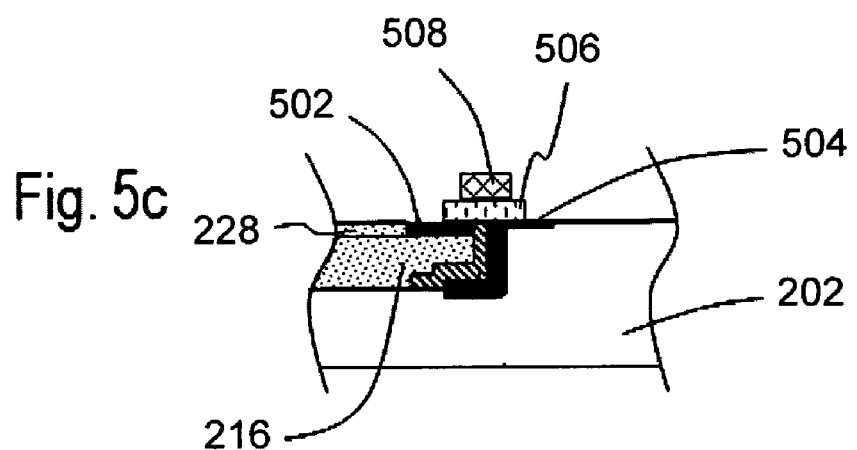
Figure 5

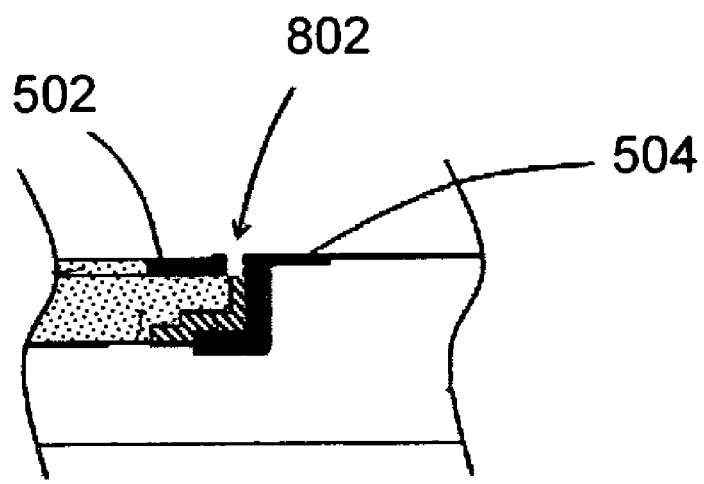
Fig. 8a
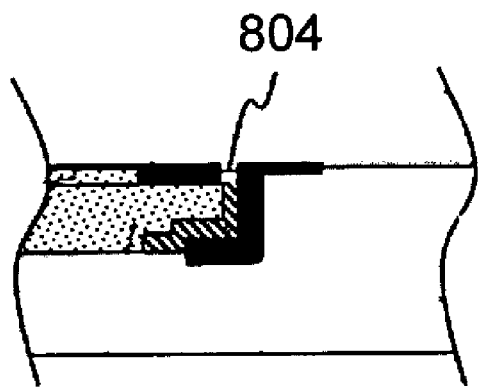
Fig. 8b
Figure 8

FABRICATION PROCESS

FIELD OF THE INVENTION

The present invention relates to a fabrication process, and in particular to a process for fabricating a planar surface feature or a spacing between planar surface features having a dimension determined by a layer thickness.

BACKGROUND

Since at least the 1990's, nanoscale processes, structures, and devices have continued to become increasingly important in many fields, including electronics, biotechnology, and sensors. Sub-microscale fabrication processes can be broadly classed as 'bottom-up' processes that build structures from smaller components such as individual atoms and/or molecules, or 'top-down' processes that build small structures from larger entities. Top-down fabrication processes generally depend upon lithographic processes such as optical or electron beam lithography to define the lateral dimensions of microscale or sub-microscale features on a generally planar substrate or wafer. However, as the lateral dimensions of these features continue to decrease with technological and market needs, the lithographic processes and tools used to define these become increasingly expensive as the capabilities of each new generation of tools, in particular their spatial resolution, are stretched beyond the limits of the previous generation. Accordingly, leading edge tools and processes such as electron beam lithography, deep-UV and immersion optical lithography can be prohibitively expensive for many applications. Moreover, even where such tools are used, the yield of successfully fabricated structures or devices is typically quite low.

As an example, although conventional electronic-beam lithography has been employed to fabricate ultra-small separations between planar electrodes in electronic devices, nanometer length scale separation is still a challenge. Although very expensive lithographic tools and complex processes have been developed to fabricate transistors with ever-decreasing channel lengths, they are only able to cater for specific materials and processes and therefore cannot be generally applied to fabricate other types of structures having similar dimensions. In the field of molecular electronics, very complex processing schemes have been required to fabricate molecular transistors, and yet have only been able to produce extremely low yields of such devices.

It is desired to provide a fabrication process that alleviates one or more of the above difficulties, or at least that provides a useful alternative.

SUMMARY OF THE INVENTION

In accordance with the present invention, a fabrication process and thin film device formed thereof is described. According to the process one or more layers are formed on at least a sidewall of a topographical feature of a substantially planar substrate, where the sidewall is substantially orthogonal to the substrate. Respective portions of the one or more layers are planerized to form a planar surface substantially parallel to the substrate, where the planar surface has respective co-planar surfaces of the one or more layers, and at least one of the surfaces has a dimension determined by a thickness of the corresponding layer.

BRIEF DESCRIPTION OF THE DRAWINGS

Preferred embodiments of the present invention are hereinafter described, by way of example only, with reference to the accompanying drawings, wherein:

FIGS. 2a to 2i are schematic cross-sectional side views of a structure produced by respective steps of one embodiment of the fabrication process;

FIGS. 5a to 5c are schematic cross-sectional side views of a three terminal device based on the structure of FIG. 2i in accordance with one embodiment;

FIGS. 8a and 8b are schematic cross-sectional side views illustrating the replacement of the exposed portion of the second layer of the structure of FIG. 2I with another material in accordance with one embodiment;

DETAILED DESCRIPTION OF THE PREFERRED EMBODIMENTS

Figure 1A:
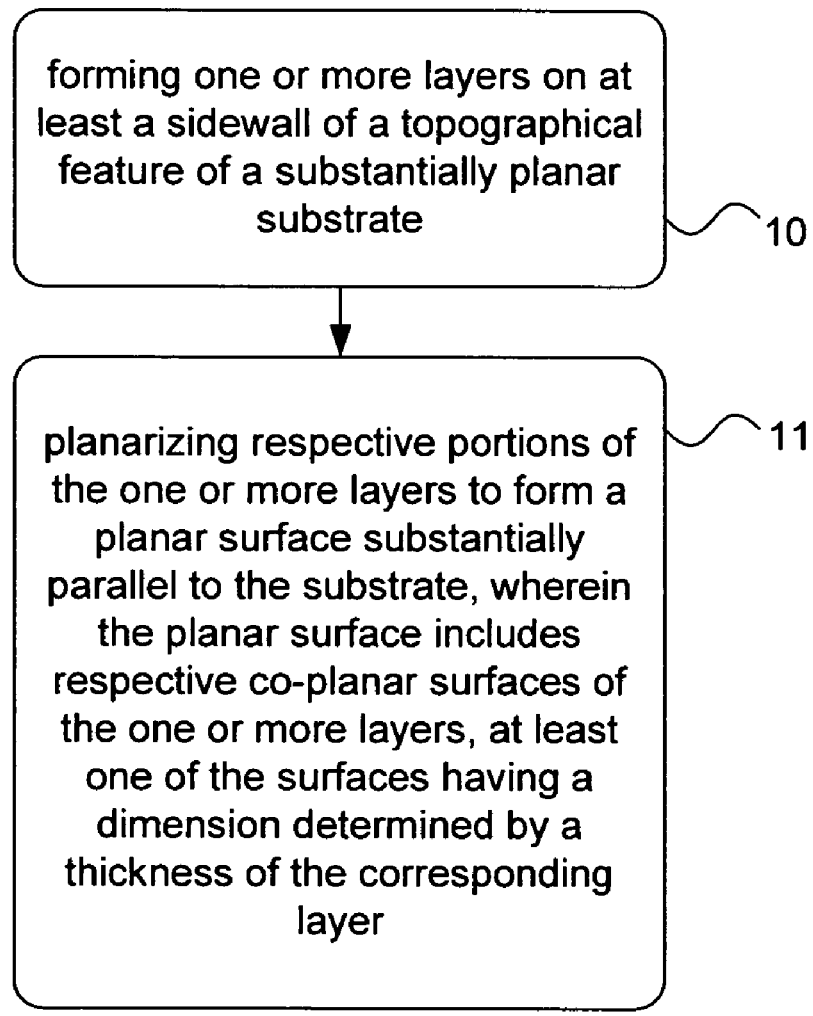
FIG. 1a is a flow diagram of an embodiment of a fabrication process.

In the Figures and in the description that follows, like reference numerals refer to like elements.

In general, the fabrication processes described herein provides a means of bypassing expensive lithography tools and complex processing schemes in defining ultra-small (e.g., nanoscale or molecular scale) physical features and/or separations between features such as electrical contacts or mechanical structures. They also provide generic base processes and structures for fabricating a variety of more complex electronic, mechanical, and/or electromechanical structures, devices and/or sensors, including nanoscale transistors and memory devices and molecular electronics.

A flow diagram of a fabrication process is shown in FIG. 1a. In accordance with the process, at step 10 one or more layers are formed on at least a sidewall of a topographical feature of a substantially planar substrate. According to this embodiment, the sidewall is substantially orthogonal to the substrate. At step 11 respective portions of the one or more layers are planarized to form a planar surface substantially parallel to the substrate, wherein the planar surface includes respective co-planar surfaces of the one or more layers, at least one of the surfaces having a dimension determined by a thickness of the corresponding layer.

Figure 1B:
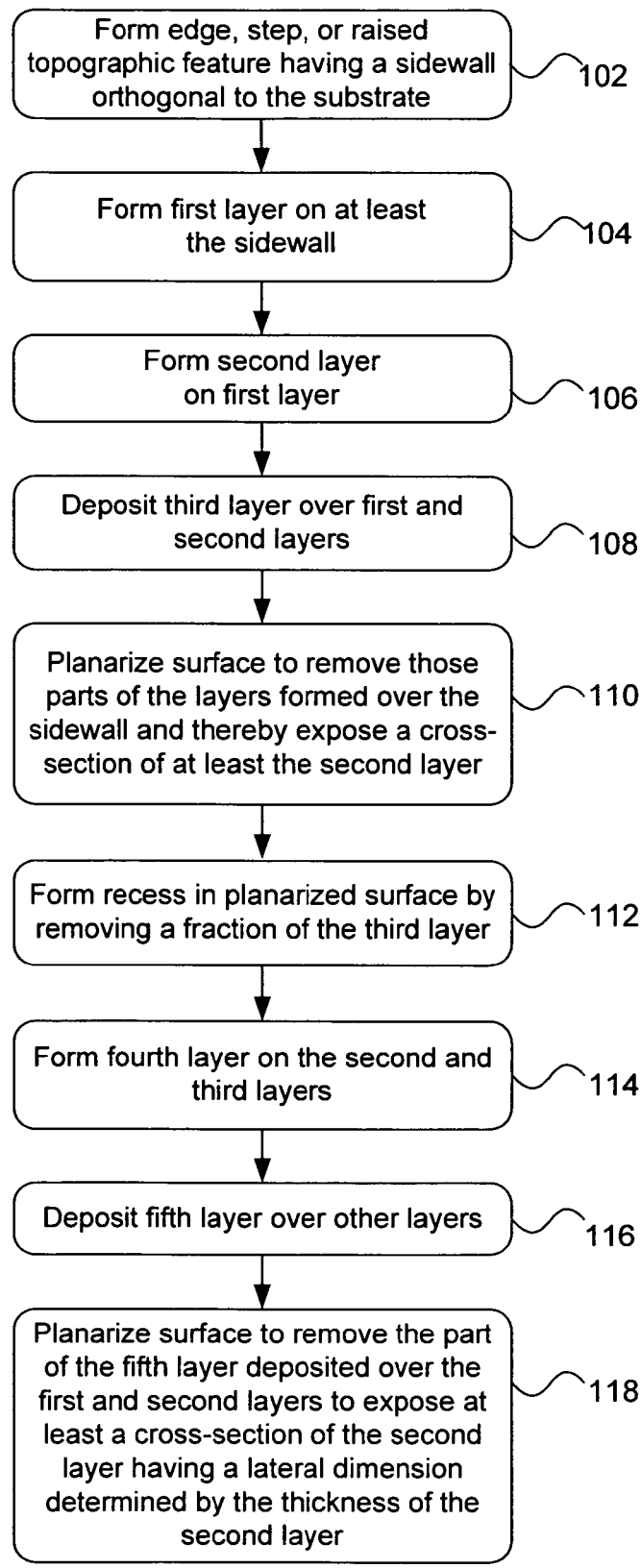
FIG. 1b is a flow diagram of a first embodiment of a fabrication process.
Figure 3:
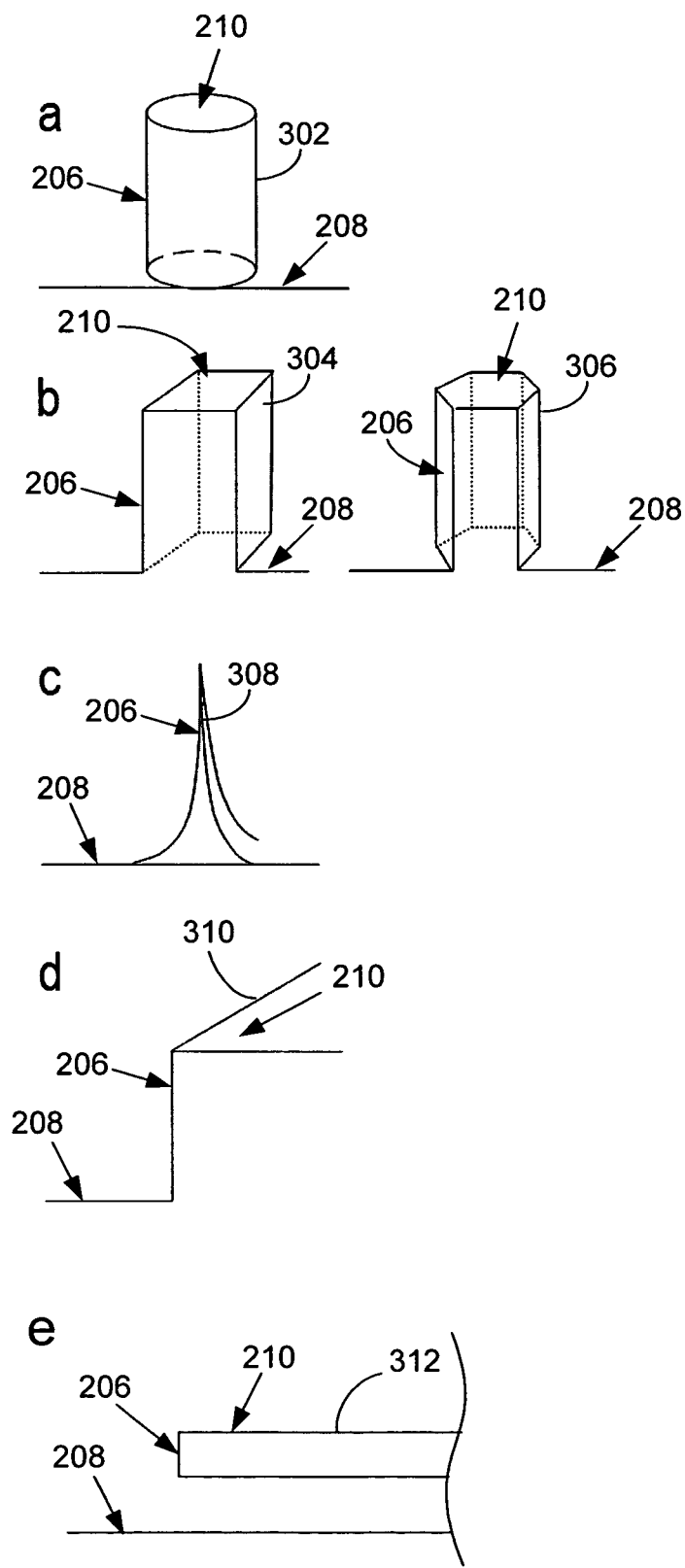
FIGS. 3a to 3e are schematic views of different structures that can be produced by the first step of one embodiment of the fabrication process.

A flow diagram of a more detailed embodiment of a fabrication process is shown in FIG. 1b. The fabrication process is described with reference to a generally planar substrate 202 (FIG. 2), whose generally planar surface is considered to define a horizontal orientation. It should be understood that the terms 'horizontal' and 'vertical' are used in this specification to refer to orientations relative to the coordinate system defined by the substrate 202, wherein the substrate is generally planar in a geometric plane that is deemed to be oriented horizontally, and a feature such as a sidewall, being substantially orthogonal to that direction, is therefore considered to be substantially vertical in orientation. Although in most cases it is expected that, during processing, the substrate 202 will in fact be oriented in a horizontal direction substantially perpendicular to the Earth's gravitational field, the substrate 202 can, however, be oriented in any direction.

Referring to FIG. 2a, a well-defined edge, step or raised topographic feature 204 having a sidewall 206 is formed on the substrate 202 at step 102.

The substrate 202 is preferably a rigid material, but may alternatively be a flexible material such as a plastic. In particular, the substrate 202 is preferably a standard semiconductor wafer such as a silicon (Si) wafer, a silicon-on-insulator (SOI) or a silicon-on-sapphire (SOS) wafer, a Group II-VI semiconductor wafer, or a Group III-V semiconductor wafer, but may alternatively be a sapphire wafer, or even an anodized metal sheet. The topographic feature 204 can be a raised feature, for example, a cylindrical 302 or polygonal 304, 306 pillar, a sharp-apex tip 308; an extended step-like feature or ledge 310; or even a horizontally extending cantilever 312 supported above a surface 208 of the substrate 202, as illustrated in FIGS. 3a to 3e, respectively. In each case, the feature 204 has a substantially vertical sidewall 206 substantially orthogonal to the horizontal plane or surface 208 of the substrate 202. With the exception of the sharp-apex tip 308, the other types of feature also have a generally horizontal top surface 210 substantially orthogonal to the sidewall 206, and, with the exception of the suspended cantilever 312, also have a generally horizontal bottom surface that may be the wafer surface 208 as shown, also substantially orthogonal to the sidewall 206, and thus in many ways can be considered to define a step.

The feature 204 and hence its sidewall 206 can be, in general, formed by any one of a variety of standard additive or subtractive processing methods, including but not limited to (i) bottom-up growth of a well-defined nanostructure such as a nanowire or a nanotube, (ii) top-down subtractive processes such as reactive-ion or wet chemical etching, laser ablation, or sputtering (iii) nano-embossing, nano-contact soft lithography, nano-imprinting, (iv) anisotropic etching, and (v) additive patterning. If desired, a plurality of well-defined raised features can be formed from or on the substrate 202 using one or more of these methods.

Referring to FIG. 2b, a first layer 212 is formed on at least the sidewall 206 of the feature 204 at step 104 of the fabrication process. It should be understood that when a layer is described in this specification as being "formed on" a pre-existing layer or region, the newly formed layer may be either deposited on the pre-existing layer or region, or may be formed by modifying the physical and/or chemical structure of the surface of the pre-existing layer or region. The specific processing step or steps by which this is achieved depends at least in part on the nature of the substrate 202 and the requirements of the application. For example, in the case where the substrate 202 is a semiconductor wafer, an ion-implantation step followed by a rapid-thermal annealing step can be used to form the first layer 212 from the surface layer of the wafer itself. Similarly, the exposed surface of the substrate 202 could be reacted with an ambient gas to form the first layer 212 as a compound surface layer such as an oxide or nitride, for example. Alternatively, the first layer 212 can be deposited on at least the sidewall 206 of the feature 204, rather than formed from it, preferably using one or more deposition techniques that promote conformal surface coverage. The first layer 212 may or may not be electrically conductive, depending on the application.

If the first layer 212 is formed by deposition, the deposited layer 212 may be a thin film of an electrically conductive material such as a highly doped semiconductor, a semi-metal, silicide, conductive polymer, or metal. In the case where the substrate 202 is a silicon wafer, suitable metals include titanium, titanium nitride, tantalum, tantalum nitride, nickel, cobalt, palladium, platinum, chromium or any combination of these metals and/or other metals. Any one of a variety of standard deposition techniques can be employed to deposit the first layer 212, depending upon its composition, including but not limited to physical vapor deposition (e.g., sputtering), chemical vapor deposition (CVD), selective epitaxy, atomic layer deposition or epitaxy, thermal evaporation, ion-beam deposition, molecular-beam deposition or epitaxy, electrodeposition, and printing techniques. Conductive polymers can be deposited by a printing or evaporation process. However, if the substrate is a polymer, deposition processes that would lead to deterioration (e.g., expansion, shrinkage, and/or decomposition) of the substrate preferably are avoided. Although the first layer 212 is preferably electrically conductive, this may not be required for some applications, in particular where the first layer 212 does not provide an electrical contact, or where the first layer 212 is a sacrificial or dummy layer, as described below.

Referring to FIGS. 1b and 2c, a second layer 214 is formed (106) on at least a part of the first layer 212 on the sidewall 206 and typically over all or nearly all of the first layer 212. As shown in FIG. 2c, the second layer 214 may have the same lateral dimensions as the first layer 212 but be offset from the first layer 212 by a fraction of its size in the corresponding direction. As described above for the first layer 212, the second layer 214 can be composed of any one or more of many different kinds of materials and in general may be formed from a surface portion of the first layer 212 or alternatively and preferably may be deposited over the first layer 212 using one or more deposition processes such as those described above. However, if the first layer 212 is electrically conductive, an insulating or high dielectric constant (k) material such as hafnium oxide or zirconium oxide may be advantageously used, as described further below. The thickness of the second layer 214 may be as large as several micrometers or may be as small as only a few atomic layers.

Referring to FIGS. 1b and 2d, a third layer 216 is formed (108) on the second layer 214. The third layer 216 is significantly thicker than the first and second layers 212, 214, and in particular is sufficiently thick that its top surface at any point is always higher than the highest part of the first and second layers 212, 214. Accordingly, the third layer 216 is preferably formed from an encapsulation material to conformally and completely cover the surface topography. Advantageously, the encapsulation material can be an insulator and may include silicon dioxide, silicon nitride, spin-on-glass, a low-k dielectric, or a non-conducting polymer, for example. Additional processing steps including but not limited to reflow of the encapsulation material, re-deposition of the encapsulation material and deposition of one or more dummy layer(s) can be performed to improve planarity.

Referring to FIG. 2e, the at least one of the layers are planarized (110). In one embodiment, a global chemical mechanical polishing (CMP) or purely mechanical polishing step is performed to obtain a planarized top surface 222 and to remove parts of the deposited layers 212, 214, 216 to expose a cross-sectional surface feature 218 of at least the second layer 214. Alternating sequences/combination of polishing, reflow and re-deposition steps can be performed if desired to improve the quality of the planarized top surface. The planarized surface 222 reveals a cross-section of the second layer 214 and it will be apparent that the width 220 (FIG. 2f) of that surface feature 218 is determined by the thickness of the second layer 214. Although it is generally preferred that the planarization removes only a fraction of that part of the first layer 212 that is formed on the top surface 210 of the feature 204 (other than where the feature 204 does not have a substantial top surface such as a generally conical or spike-like feature such as the feature 308 shown in FIG. 3c), alternatively the entirety of that part of the first layer 212 can be removed by the planarization step 110 so that a dimension of the first layer 212 is also determined by the thickness of the first layer 212 formed on the feature sidewall 206.

Referring to FIG. 2f, a recess 224 is formed in the planarized surface at step 112 by selective uniform and partial removal of the third layer or encapsulation material 216. Depending on the materials used, this may be achieved by removal processes including but not limited to selective reactive-ion etching or selective solvent etch-back processes. Depending on the process used, the depth of the recess 224 may be controlled by controlling either the duration of the removal process or the chemistry of the removal processes.

Referring to FIG. 2g, a fourth layer 226 is formed on the one or more layers (e.g., first, second and third layers 212, 214, 216) at step 114. The fourth layer 226 can be electrically conductive and is formed from the same material as the first layer 212, as shown, although as described above this may not be necessary or appropriate for some applications.

Referring to FIG. 2h, a fifth layer 228 is formed on at least the third and fourth layers 216, 226 at step 116. As described above for the third layer 216, the fifth layer 228 is preferably sufficiently thick that its top surface at any point is higher than the highest parts of the other deposited layers 212, 214, 216, 226. Accordingly, the fifth layer 228 can be formed from an encapsulation material, the same encapsulation material and using the same process as used to form the third layer 216, to conformally and completely cover the surface topography.

Referring to FIG. 2i the at least one or more layers are planarized (118). In one embodiment, a second global chemical mechanical polishing or purely mechanical polishing step is performed to obtain a planarized top surface 230, preferably using the same process step(s) used for the first planarization step 110, such that the remaining portions of the first, second, and fourth layers 212, 214, 226 are exposed in that surface. Accordingly, the surface is planarized to remove the part of the fifth layer deposited over the first and second layers to expose at least a cross-section of the second layer having a lateral dimension determined by the thickness of the second layer.

Figure 4:
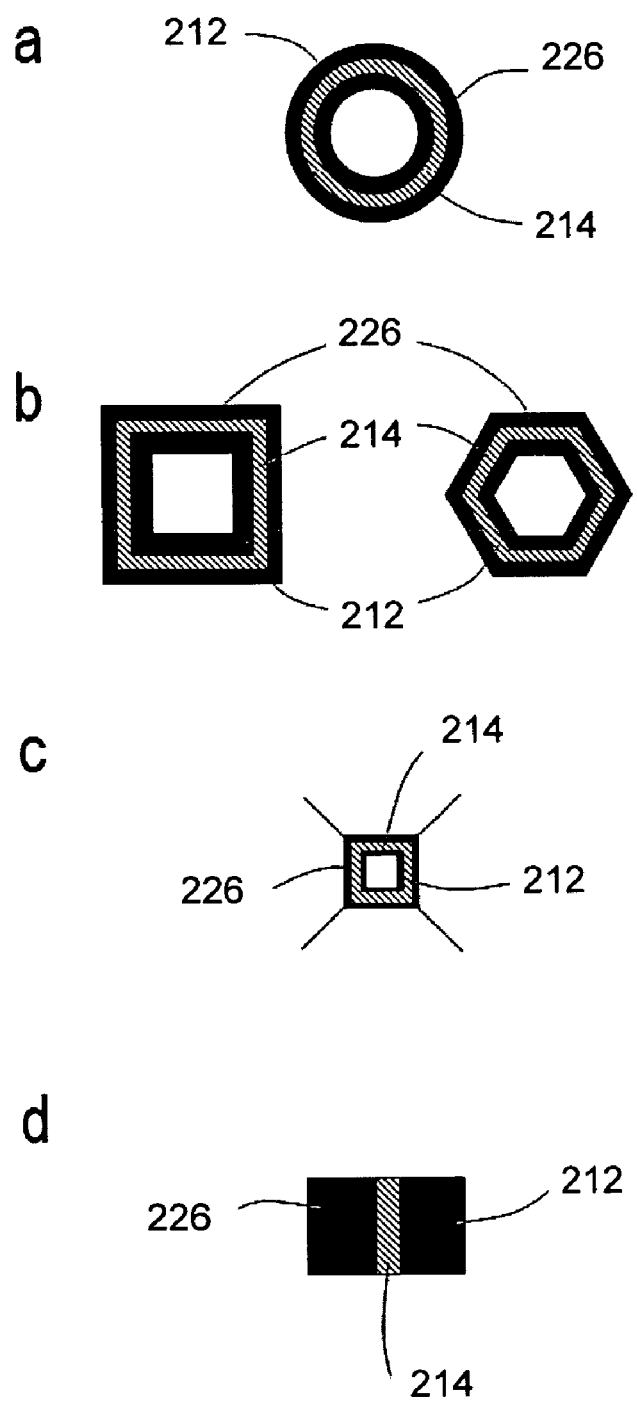
FIGS. 4a to 4d are schematic plan views of structures produced by the fabrication process using the respective structures shown in FIGS. 3a to 3d.

For illustration purposes, FIG. 4 shows plan views of the resulting structures based on the respective raised features 302 to 310 shown in FIGS. 3a to 3d; in each case the second layer 214 is formed from a first material sandwiched between two electrical contacts provided by the remaining portions of the first and fourth layers (i.e., layers 212 and 226, respectively), both formed from the same electrically conductive second material.

Significantly, it will be appreciated that the structures produced by the fabrication process, and in particular the remaining exposed part of the second layer 214, has a lateral physical dimension in the plane of the substrate 202 that is not determined by lithography, but rather by the thickness of the second layer 214 formed on the sidewall 206. Because the various reaction or deposition processes that can be used to form the second layer 214 can be applied to accurately and reproducibly control the thickness of the second layer 214, in some cases down to the atomic scale, the lateral dimension 220 of the second layer 214 can be similarly controlled. In other words, the lateral dimension 220 of the exposed part of the second layer 214 is not limited by the constraints of lithography, but rather by the accuracy of the formation process used to form that layer 214 and the planarization process used to expose that part. As shown in FIGS. 2b to 2i, although it is preferred that the first, second, and fourth layers 212, 214, 226 are formed in laterally restricted regions defined by a lithographic process, it is conceivable that lithography may not be required at all for some applications.

Structures formed by the fabrication process, such as those illustrated in FIGS. 4a to 4d, can serve as base platforms for a wide variety of applications, and in particular additional processing steps can be used to fabricate microscale or nanoscale structures, electronic, mechanical and/or electromechanical devices and/or sensors from these basic structures. In particular, these basic structures are particularly suitable for fabricating electronic switches for electronics and display technologies. An electronic switch having either two terminals or three terminals can be fabricated from these basic structures, as described below.

For example, FIGS. 5a to 5c illustrate the fabrication of a three-terminal device from the basic structure produced by the fabrication process of FIG. 1b and shown in FIGS. 2i and 5a. The first and fourth layers 212, 226 are assumed to be highly electrically conductive, and for convenience of description, the remaining portions of these layers are also referred to herein as the left region (layer 226) or contact 502 and the right region (layer 212) or contact 504 (FIG. 5b). In the case of a three terminal electronic or electro-optical device such as a field-effect transistor, the left and right regions/contacts may be considered to constitute a source contact 502 and a drain contact 504 for the device.

Referring to FIG. 5b, with a planarized surface topography as shown in FIGS. 2i and 5a, a thin film 506 of a high dielectric constant material such as hafnium oxide or zirconium oxide is deposited to provide a gate oxide or equivalent thereof. A variety of deposition techniques including but not limited to physical vapor deposition, chemical vapor deposition, atomic layer deposition, thermal evaporation, ion-beam deposition, molecular-beam deposition and printing techniques can be employed to deposit the gate oxide 506.

Figure 6:
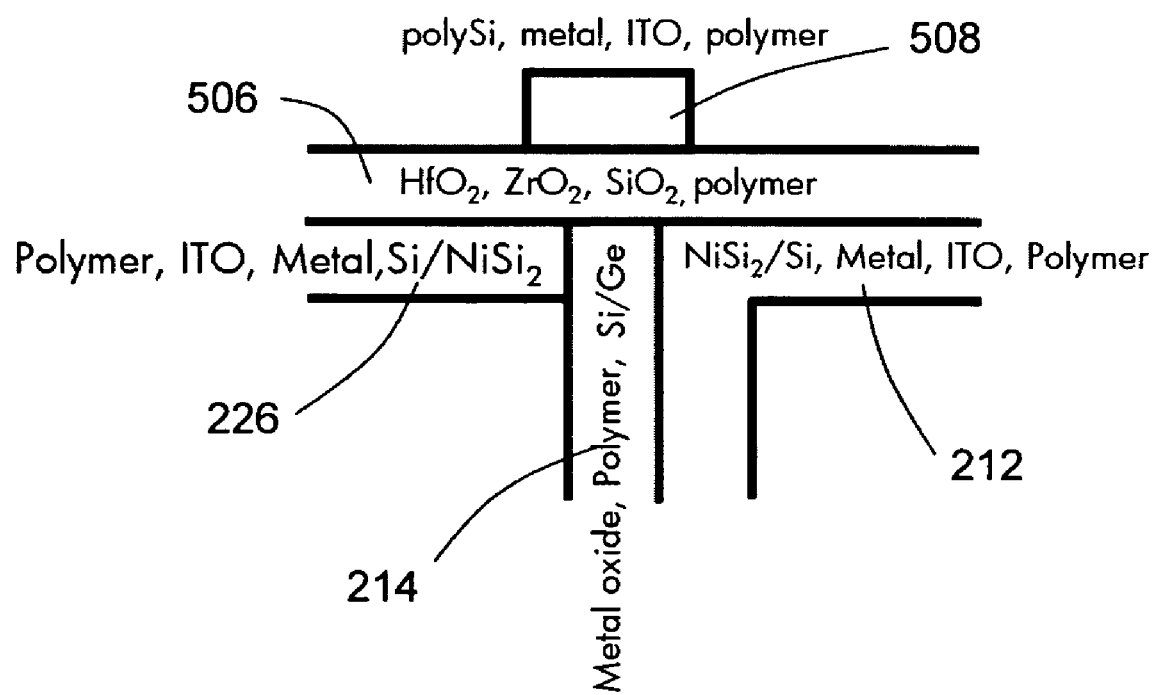
FIG. 6 is a schematic cross-sectional side view of a generic three terminal device based on the structure of FIG. 2i, illustrating various combinations of materials that can be used to fabricate the device in accordance with one embodiment.

Referring to FIG. 5c, a top gate electrode 508 is deposited to complete the fabrication of the three-terminal device. Heavily-doped polysilicon or metal or a combination of these materials can be used for the top gate electrode 508. Examples of the different materials that can be used to constitute the source 502 and drain 504 contacts, the gate oxide 506 and the gate electrode 508 are shown in FIG. 6. All-transparent three-terminal devices that act as control switches for all-transparent high resolution displays can be fabricated by selecting sufficiently thin and/or otherwise optically transparent materials such as Indium Tin Oxide (ITO) and/or polymers.

Figure 7A:
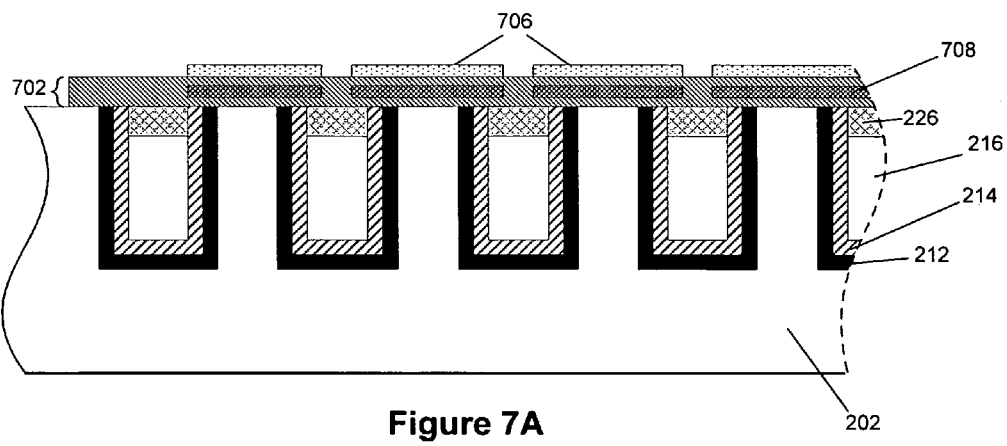
FIGS. 7a and 7b are a cross-sectional side view and a plan view, respectively, of a non-volatile memory storage array based on a NOR memory architecture and formed in accordance with one embodiment of the fabrication process.
Figure 7B:
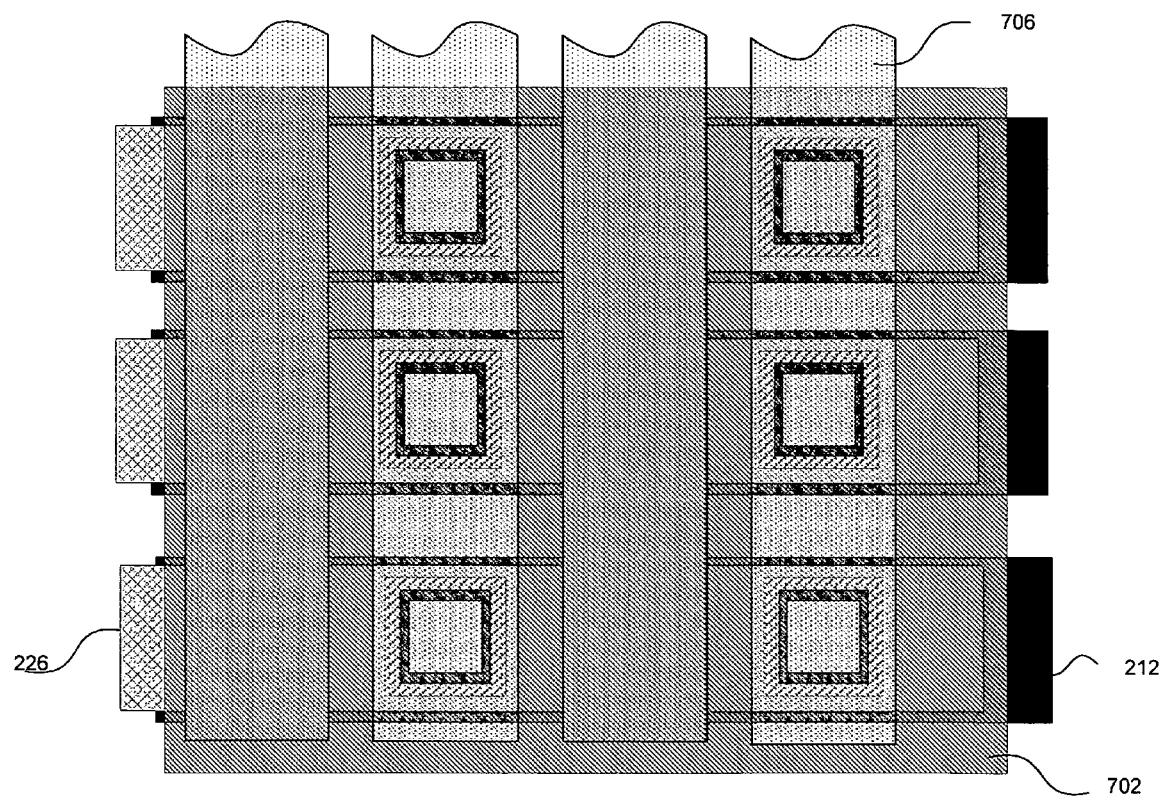
Figure 7C:
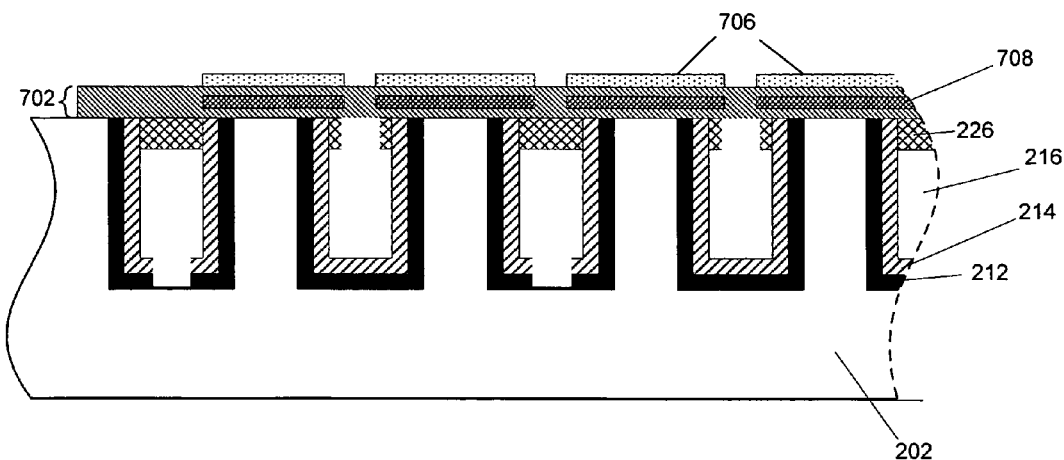
FIGS. 7c and 7d are a cross-sectional side view and a plan view, respectively, of a non-volatile memory storage array based on a NAND memory architecture and formed in accordance with one embodiment of the fabrication process.

In a further extension of the processing scheme illustrated in FIG. 5, a charge storage layer 702 sandwiched between a semiconductor 214 and a control gate 706 (control line) constitute a single cell of a nanoscale non-volatile flash memory device, as shown in the NOR architecture device of FIGS. 7a (cross-sectional side view) and 7b (plan view) and the NAND architecture device of FIGS. 7c (cross-sectional side view) and 7d (plan view). The charge storage layer 702 can be an oxide-nitride-oxide (ONO) layer or a layer incorporating semiconductor nanocrystals or other nanoscale entities sandwiched between oxide layers.

Figure 7D:
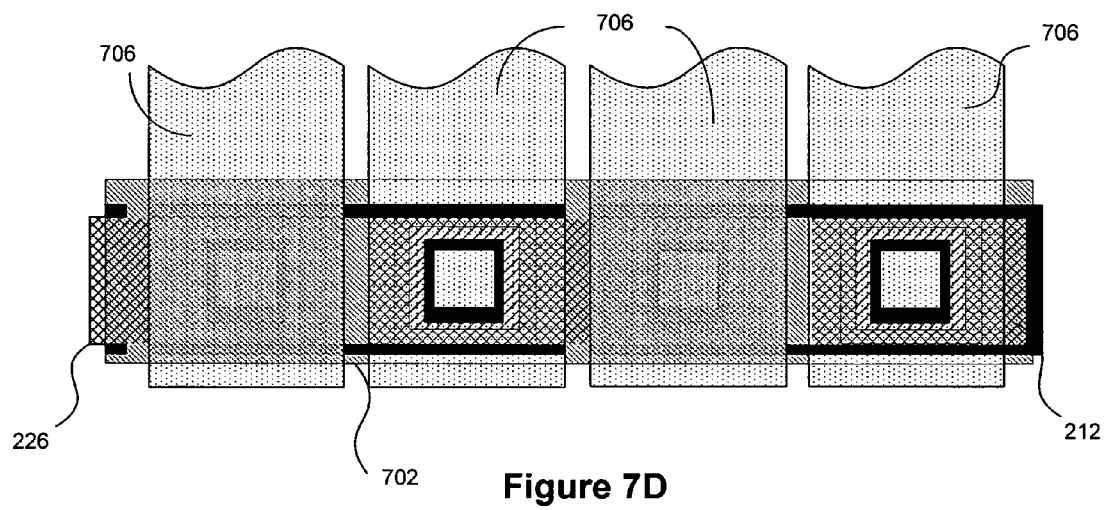

In the NOR architecture device of FIGS. 7a and 7b, the first layer 212 provides the source line and the fourth layer 226 provides the bit line. In the NAND architecture device of FIGS. 7c and 7d, the first layer 212 provides the bit line and the fourth layer 226 provides the source line, with the outermost control gates 706 being bit line select lines 708 and the inner control gates 706 being word lines of the device.

As described above, the second layer 214 may be made from a material whose properties play a fundamental role in the finalised structure or device (e.g., a smart material, or a material having specific and possibly non-linear optical and/or magnetic properties), and can thus be referred to as an "active" material. Alternatively, the second layer 214 can be an essentially inert material whose function in the final structure or device is purely to define the spacing between the left region or contact 502 and the right region or contact 504, and may thus be referred to as a "dummy" material. FIG. 8 illustrates a processing scheme whereby the second layer 214 is a dummy material that is at least partly removed by performing a selective partial removal of the second layer 214 to define a recess channel or gap 802, as shown in FIG. 8a, using a selecting subtractive process such as selective reactive-ion etching or a selective solvent etch-back process. Depending on the subtractive process used, the depth of the recess 802 can be controlled by controlling the duration of the removal processes and/or the chemistry of the removal process.

For some applications, the recess, channel, or gap 802 may perform a useful function in its own right. For example, a small entity such as a biological cell, a part of a cell, or even a single molecule can be placed in the gap 802, where the left region 502 and the right region 504 may provide, for example, an electric or magnetic field within the gap 802, or may transport an optical signal across the gap 802. Alternatively, the gap 802 may define an elongated channel for microscale or nanoscale fluidic applications, and may be sealed by bonding the planarised surface to a planar superstrate, which may be composed of the same material as the substrate 202, or a silicon or glass wafer, for example, bonded by an anodic bonding, direct bonding, glass frit, or adhesive process.

Figure 9A:
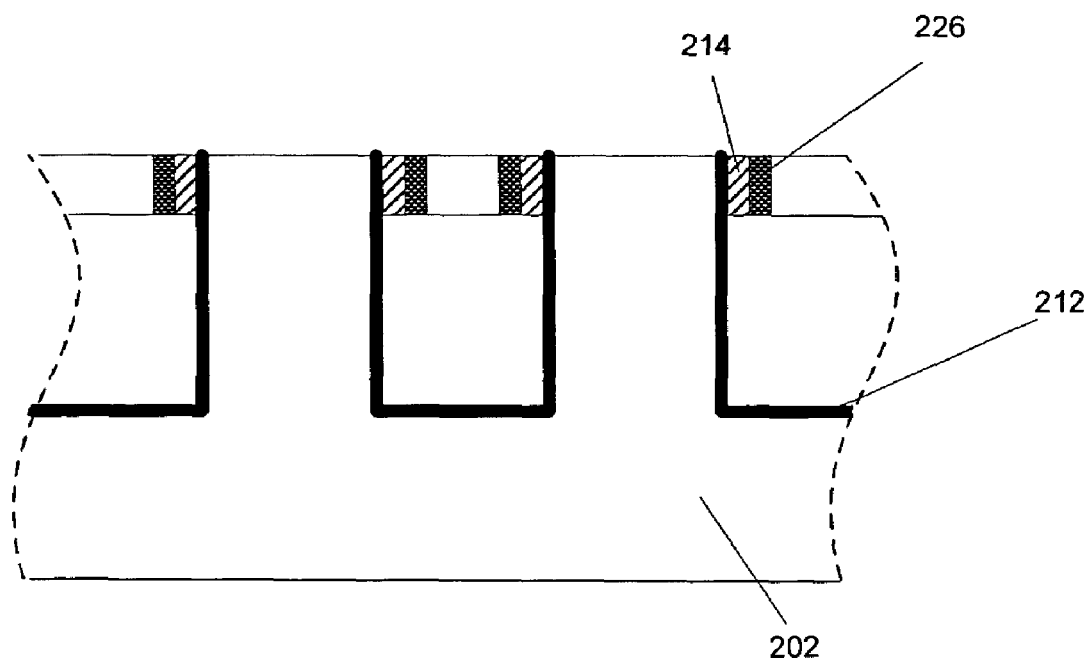
FIGS. 9a and 9b are a cross-sectional side view and a plan view, respectively, of an ultra-high density cross-bar matrix formed in accordance with one embodiment of the fabrication process.
Figure 9B:
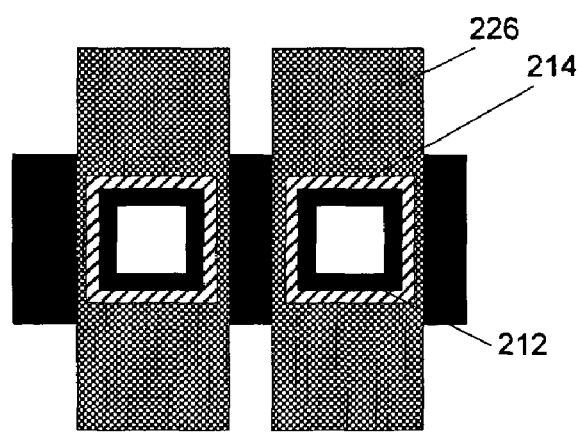

Alternatively, the gap 802 between the first 502 and second 504 regions may be filled with a different material. For example, referring to FIG. 8b, a substitute material 804 can be deposited to fill in the gap 802 between the first 502 and second 504 regions. The substitute material 804 may include but is not limited to organic/inorganic molecules, metal chalcogens, and semiconducting polymers. A molecular-scale physical separation between the first 502 and second 504 regions can be controlled by careful selection of processing conditions which take into consideration any interdiffusion of the two regions 502, 504 with the substitute material 804. The substitute material 804 can be selected to exhibit desired electronic, optoelectronic, and/or magnetic properties. By shrinking all components of the structure/device, a plurality of such devices or structures can be fabricated on a single die or substrate to provide, for example, an ultra-high density and ultra-high speed computing chip. Due to the reliability of the fabrication process, high device fabrication yields can be achieved. For example, FIGS. 9A and 9B show cross-sectional and side views, respectively, of an ultra-high density memory device, where the first and fourth layers 212, 226 are conductors, and the second layer 214 includes inorganic and/or organic molecules attached to the conductors 212, 226. Other processing steps can be performed to incorporate organic or inorganic dielectrics, acting as a gate oxide, and a top organic/inorganic gate can be used to provide additional functionalities to the device.

Alternatively, either or both of the first layer 212 and the fourth layer 226 can be made from a sacrificial material (e.g., $SiO_2$) that is removed by a subsequent subtractive process step to leave at least the remaining part of the second layer 214 as a free-standing structure. Such a structure, or an array or other arrangement of a plurality of such structures, may be useful for a wide variety of mechanical, electro-mechanical, and/or optical applications.

Figure 10A:
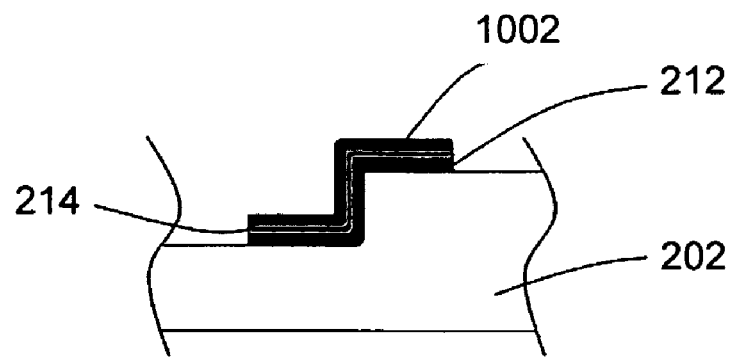
FIGS. 10a and 10c are schematic cross-sectional side views illustrating a fabrication process in accordance with a second embodiment of the invention.
Figure 10B:
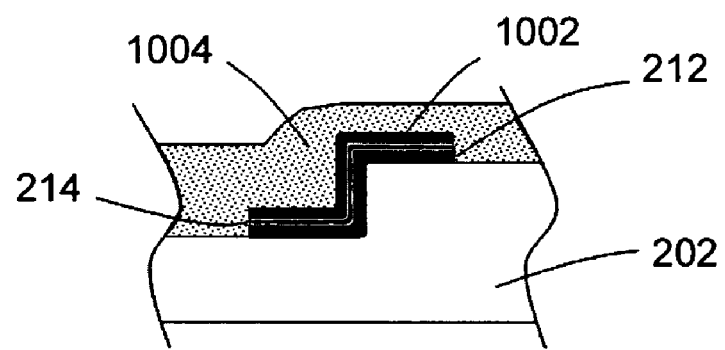
Figure 10C:
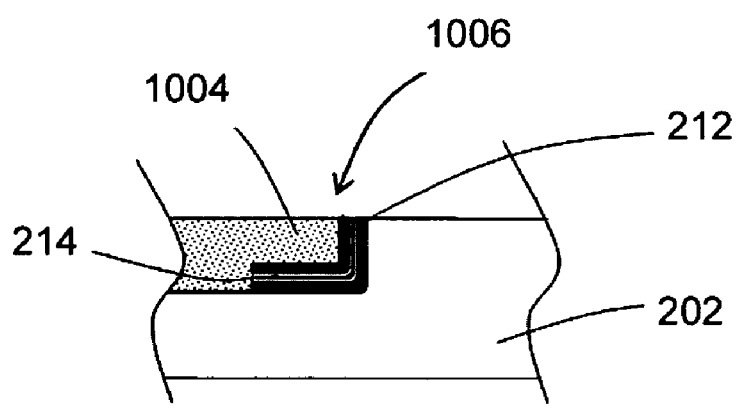
Figure 11:
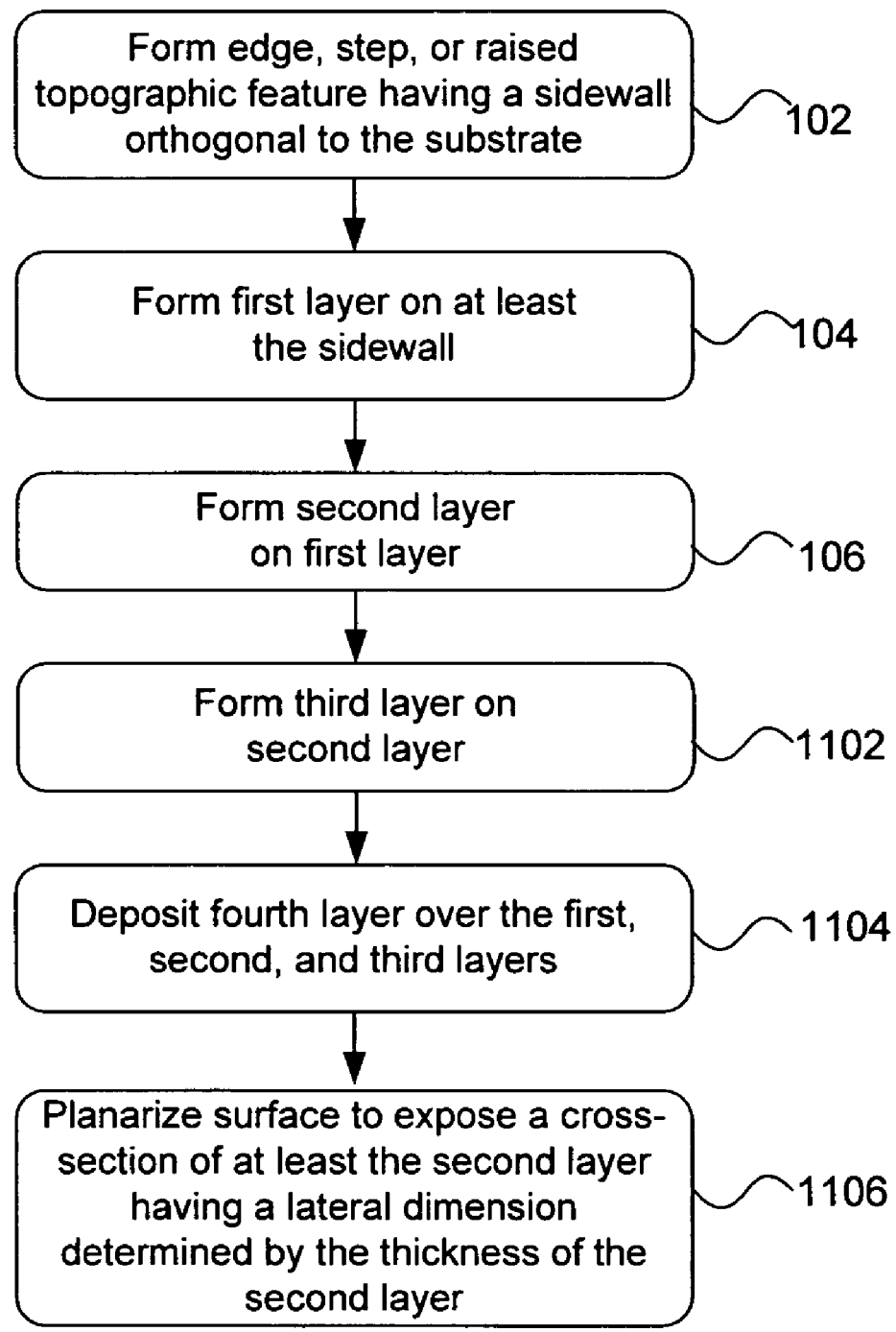
FIG. 11 is a flow diagram of the fabrication process of the second embodiment of the invention.

In a second preferred embodiment, as shown in FIGS. 10 and 11, a simplified fabrication process requiring only four layer formation steps and only one planarization step can be used. The first three steps 102, 104, 106 of this process are identical to those of the first preferred embodiment described above. However, rather than forming a thick or encapsulating third layer 216 followed by a relatively thin fourth layer 226, as described above and shown in FIG. 2d, a non-encapsulating third layer 1002 is formed, preferably by printing means, at step 1102, followed by a relatively thick or encapsulating fourth layer 1004, also preferably deposited by printing means, at step 1104. At step 1106, the horizontally extending parts of the second and third layers are removed by a planarization process such as CMP or mechanical polishing. As shown in FIG. 10c, at least a portion of that part of the first layer 212 extending over the top surface 210 of the substrate 202 is also removed in this step. In this embodiment, only one planarization step is required, whereas two planarization steps were required in the first preferred embodiment described above. However, as will be evident from a comparison of FIGS. 2i and 10c, in this second embodiment, the exposed portion 1006 of the third layer 1002 has a lateral dimension that is only as large as the thickness of that layer 1002, whereas in the first embodiment, that dimension was defined by the dimension of the layer as initially formed (e.g., as defined by lithography, for example). Thus the first embodiment may be more preferred where the third layer 212 is used as an electrical contact, for example to facilitate alignment to that contact. In contrast, this arrangement of FIG. 10c may be preferred where it is desired to establish carefully controlled and very small dimensions for both the second and the third layers 214, 1002, and it will be apparent that additional layers may be deposited prior to encapsulation and planarization in order to form multi-layer structures (e.g., a magnetic spin valve) having carefully controlled and ultra-small (e.g., nanoscale) dimensions in the plane of the substrate 202.

Many modifications will be apparent to those skilled in the art without departing from the scope of the present invention as hereinbefore described with reference to the accompanying drawings.

The invention claimed is:

1. A fabrication process, comprising:
    forming plural layers on at least a sidewall of a topographical feature of a substantially planar substrate, the sidewall being substantially orthogonal to a surface of the substrate; and
    planarizing respective portions of the plural layers to form a planar surface substantially parallel to the surface of the substrate, wherein the planar surface includes respective co-planar surfaces of the plural layers, at least one of the co-planar surfaces having a dimension determined by a thickness of the corresponding one of the plural layers.

2. The fabrication process of claim 1, wherein at least one of the plural layers is formed by modifying a physical structure and/or composition of a surface of the sidewall or a surface of a layer previously formed on the sidewall.

3. The fabrication process of claim 2, wherein the sidewall or the layer previously formed on the sidewall is a semiconductor and the step of modifying includes modifying the electrical conductivity of the semiconductor.

4. The fabrication process of claim 1, wherein at least one of the plural layers is formed by deposition.

5. The fabrication process of claim 1, wherein the topographic feature is selected from the group consisting of a cylindrical structure, a rectangular structure, a hexagonal or prismatic column, a spike, a step, and a cantilever.

6. The fabrication process of claim 1, further comprising:
depositing a planarization layer over the plural layers;
wherein the step of planarizing includes planarizing the plural layers and the planarization layer to form the planar surface substantially parallel to the surface of the substrate, the planar surface including co-planar surfaces of the planarization layer and the plural layers, at least one of the co-planar surfaces of the plural layers having a dimension determined by the thickness of the corresponding layer.

7. The fabrication process of claim 6, further comprising:
forming a step in the planar surface by reducing a thickness of at least part of the planarization layer, the step having a sidewall provided by an outermost layer of the plural layers;
forming a further layer on at least the sidewall provided by the outermost layer;
depositing a second planarization layer over the further layer and the co-planar surfaces of the plural layers; and
planarizing at least the second planarization layer and the further layer to form a second planar surface substantially parallel to the surface of the substrate, the second planar surface including co-planar surfaces of the second planarization layer, the further layer, and the plural layers, at least one of the co-planar surfaces of the plural layers having a dimension determined by the thickness of the corresponding layer.

8. The fabrication process of claim 1, further comprising removing at least a portion of at least one of the plural layers to form a recess in the planar surface.

9. The fabrication process of claim 8, further comprising depositing a material in the recess.

10. The fabrication process of claim 1, wherein the plural layers include a first layer, a second layer, and a third layer, and the process further comprising removing at least a portion of the second layer between the first layer and the third layer to form a recess in the planar surface, the recess defining a gap between the first layer and the third layer.

11. The fabrication process of claim 10, further comprising depositing a material in the gap, wherein the first and third layers are electrically conductive.

12. The fabrication process of claim 7, wherein the plural layers include a first layer and a second layer, the first layer and the further layer being electrical terminals of a three terminal device, and the process further comprising:
depositing a substantially electrically insulating material on the co-planar surfaces of the first, second, and further layers; and
depositing a substantially electrically conductive material on the substantially electrically insulating material to provide a third electrical terminal of the three terminal device.

13. The fabrication process of claim 12, wherein the three terminal device includes a field effect transistor.

14. The fabrication process of claim 12, wherein the first, second, and further layers are formed from optically transparent materials, and the three terminal device is a switch for an electronic display.

15. The fabrication process of claim 7, wherein the plural layers include a first layer and a second layer, and the process further comprising:
depositing a charge storage layer on the co-planar surfaces of the first, second, and further layers; and
depositing a substantially electrically conductive material on the charge storage layer to provide a gate electrode for the charge storage layer;
wherein the first layer and the further layer are respectively a source line and a bit line of a non-volatile memory device.

16. The fabrication process of claim 15, wherein the non-volatile memory device is a NOR architecture device, wherein the first layer and the further layer are respectively the source line and the bit line of the NOR architecture device.

17. The fabrication process of claim 15, wherein the non-volatile memory device is a NAND architecture device, wherein the first layer and the further layer are respectively the bit line and the source line of the NAND architecture device.

18. The fabrication process of claim 15, wherein the charge storage layer includes one of an oxide-nitride-oxide (ONO) stack and a nanocrystal layer between oxide layers.

19. The fabrication process of claim 1, wherein the plural layers include a first layer, a second layer, and a third layer, the first layer and the third layer being electrical terminals of a three terminal device, and the process further comprising:
depositing a substantially electrically insulating material on exposed surfaces of the first, second, and third layers; and
depositing a substantially electrically conductive material on the substantially electrically insulating material to provide a third electrical terminal of the three terminal device.

20. The fabrication process of claim 1, wherein the plural layers include a first layer, a second layer, and a third layer, and the process further comprising:
depositing a charge storage layer on the co-planar surfaces of the first, second, and third layers; and
depositing a substantially electrically conductive material on the charge storage layer to provide a gate electrode for the charge storage layer;
wherein the first layer and the third layer are respectively a source line and a bit line of a non-volatile memory device.

21. The fabrication process of claim 1, wherein each of at least two of the plural layers has a first portion that is generally parallel to the surface of the substrate, and a second portion that is generally parallel to the sidewall, wherein planarizing the respective portions of the plural layers comprises planarizing the first portions of the at least two layers.

22. The fabrication process of claim 21, wherein a first of the at least two layers is electrically conductive, and a second of the at least two layers is electrically insulating, and wherein the at least one co-planar surface having the dimension comprises the second layer.

23. The fabrication process of claim 1, wherein the plural layers comprise at least a first layer formed on the substrate, and a second layer formed on the first layer, and wherein planarizing the respective portions of the plural layers comprises planarizing the respective portions of the first and second layers.

* * * * *